United States Patent [19]
Jairazbhoy et al.

[11] Patent Number: 5,986,884
[45] Date of Patent: Nov. 16, 1999

[54] METHOD FOR COOLING ELECTRONIC COMPONENTS

[75] Inventors: Vivek Amir Jairazbhoy, Farmington Hills; Michael George Todd, South Lyon; Prathap Amerwai Reddy, Farmington Hills, all of Mich.

[73] Assignee: Ford Motor Company, Dearborn, Mich.

[21] Appl. No.: 09/114,315

[22] Filed: Jul. 13, 1998

[51] Int. Cl.$^6$ ...................................................... H05K 7/20
[52] U.S. Cl. .................. 361/700; 174/15.2; 174/252; 361/720; 165/104.33; 257/714
[58] Field of Search ............................. 165/80.4, 104.33; 174/15.2, 252, 260; 257/714; 361/689, 698–699, 700–708, 719, 720

[56] References Cited

U.S. PATENT DOCUMENTS 4,602,314  7/1986  Broadbent .
5,007,478  4/1991  Sengupta ................................. 361/700
5,323,294  6/1994  Layton et al. .
5,453,641  9/1995  Mundinjer et al. ..................... 361/700

*Primary Examiner*—Gregory Thompson
*Attorney, Agent, or Firm*—Leslie C. Hodges

[57] ABSTRACT

There is disclosed herein a printed circuit board, one embodiment of which comprises: a dielectric substrate 10; a solid metallic heat sink 16 attached to or embedded within the substrate; a cavity 18 formed generally in the substrate, wherein at least one wall 20 of the cavity is defined by a surface 17 of the heat sink 16; a component mounting pad 14 disposed on the substrate proximate the cavity; a predetermined volume of electrically insulative liquid 22 contained within the cavity; and a thermally conductive member 24 embedded within the substrate, the member 24 being in direct thermal contact with each of the mounting pad 14 and the liquid 22.

23 Claims, 3 Drawing Sheets

METHOD FOR COOLING ELECTRONIC COMPONENTS

BACKGROUND OF THE INVENTION

1. Field of the Invention

The present invention relates generally to printed circuit boards, and more particularly to a method for cooling electronic components attached to a printed circuit board.

2. Disclosure Information

In the design and construction of printed circuit boards (PCBs), a common concern is thermal management of the electronic components—that is, removing excess heat from the components. This is commonly a concern with resistors, transistors, integrated circuits, and other components which are power devices.

The typical approach to cooling such components 50 is to attach a finned copper or aluminum heat sink 70 thereto using a thermally conductive adhesive 80, either directly or through thermal vias 30 having thermally conductive material 32 therein, as illustrated in FIG. 1. If the heat sink is attached to more than one component 50 (as is commonly done), then the adhesive 80 used must usually be electrically insulative, so that the thermally adjoined components 50 do not electrically short one another through the heat sink 70.

However, such adhesives 80 are often the dominant thermal resistance in the thermal path between the components 50 and the ultimate heat well (e.g., the atmosphere). Thus, although these adhesives are useful for electrically isolating yet thermally connecting more than one component, they nonetheless add a relatively high thermal resistance to the component's thermal exit path. It would be desirable, therefore, to provide a way of thermally connecting yet electrically isolating two or more electronic components without the aforementioned drawback.

SUMMARY OF THE INVENTION

The present invention overcomes the disadvantages of the prior art approaches by providing a printed circuit board comprising: (a) a dielectric substrate; (b) a solid metallic heat sink attached to or embedded within the substrate; (c) a cavity formed in the substrate, wherein at least one wall of the cavity is defined by a surface of the heat sink; (d) a component mounting pad disposed on the substrate proximate the cavity; (e) a predetermined volume of volatile, electrically insulative liquid contained within the cavity; (f) and a thermally conductive member disposed within the substrate. The member is arranged so as to be in direct thermal contact with each of the mounting pad and the liquid.

It is an object and advantage of the present invention that two or more electronic components or mounting pads may be thermally attached to a common heat sink while remaining electrically isolated from each other, without the use of thermally conductive/electrically insulative adhesive in the thermal exit path from the components/pads.

Another advantage is that the present invention may provide thermal dissipation characteristics that compete with conventional attached metal heat sinks.

These and other advantages, features and objects of the invention will become apparent from the drawings, detailed description and claims which follow.

DETAILED DESCRIPTION OF THE PREFERRED EMBODIMENTS

Figure 1:
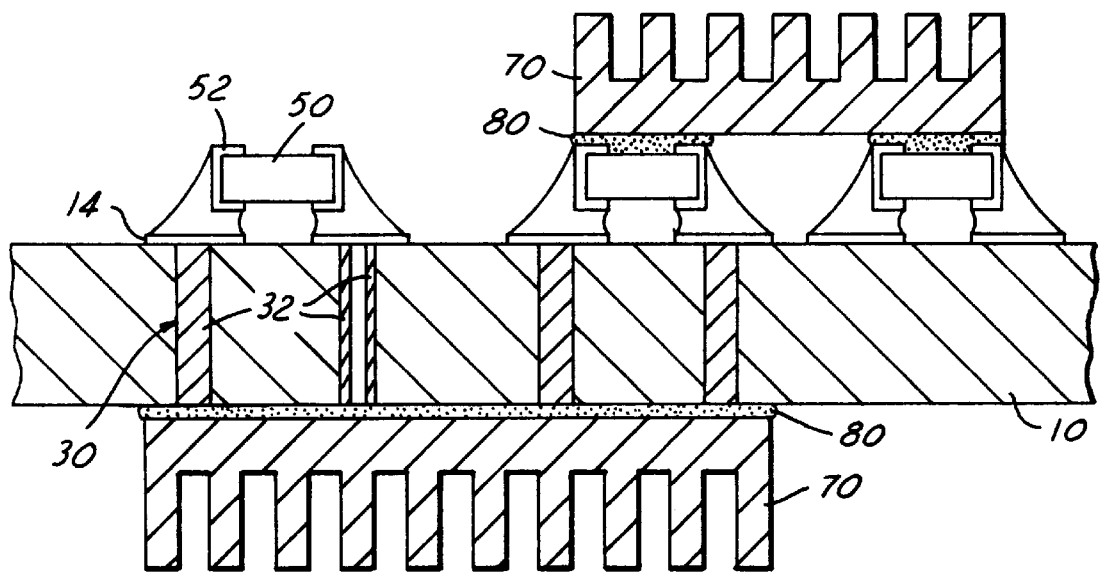
FIG. 1 is a section view of a printed circuit board according to the prior art.

Referring now to the drawings, FIGS. 2–5 show various configurations of a printed circuit board according to the present invention. The PCB comprises: a dielectric substrate 10; a solid metallic heat sink 16 attached to or embedded within the substrate; a cavity 18 formed in the substrate, wherein at least one wall 20 of the cavity is defined by a surface 17 of the heat sink 16; a component mounting pad 14 disposed on the substrate proximate the cavity; a predetermined volume of electrically insulative liquid 22 contained within the cavity; and a thermally conductive member 24 disposed within the substrate, the member 24 being in direct thermal contact with each of the mounting pad 14 and the liquid 22.

To assist the reader in understanding the present invention, all reference numbers used herein are summarized in the table below, along with the elements they represent:

10=Substrate
12*t*=Top surface of substrate
12*b*=Bottom surface of substrate
12*s*=Side surface of vertically mounted substrate
14=Mounting pad
15=Single-piece integral pad/member
15*m*=Mounting portion of mounting pad
15*e*=Embedded portion of mounting pad
16=Heat sink
16*c*=Channel through heat sink
16*f*=Finned portion of heat sink
16*p*=Plug (e.g., screw) for closing channel
16*r*=Recess in heat sink
16*v*=Vertical, submerged portion of heat sink
17=Surface of heat sink which defines cavity wall
18=Cavity
19*a*=First end of single-piece pad/member
19*b*=Second end of single-piece pad/member
20=Walls of cavity
20*c*=Ceiling of cavity
20*f*=Floor of cavity
20*s*=Side wall of cavity
22=Liquid
24=Thermally conductive member
26=Vanes/guides
30=Thermal via
32=Thermally conductive material in via
40=Solder joint
45=Capillary plate/tube
50=Surface mount component
52=Terminations
60=Downward point or edge in cavity ceiling
70=Conventional heat sink atop component
80=Thermally conductive adhesive
A=Path of vapor
B=Path of condensate The substrate 10 may be constructed of any dielectric/plastic material and is preferably injection molded, although it may alternatively be made by lamination, thermoforming, transfer molding, and other methods. Injection molding is preferred because the cavity 18 may be easily molded in, whether the cavity 18 is a surface cavity as in FIGS. 2–3 or a body cavity fully enclosed within the substrate as in FIGS. 4–5. In the case of body cavities, these may be molded within the substrate by gas-assist, vapor-assist, lost-core, or similar techniques. Injection molding is also preferred because it allows the mounting pad 14, the heat sink 16, and/or the thermally conducting member 24 to be insert-molded into the substrate.

Figure 2:
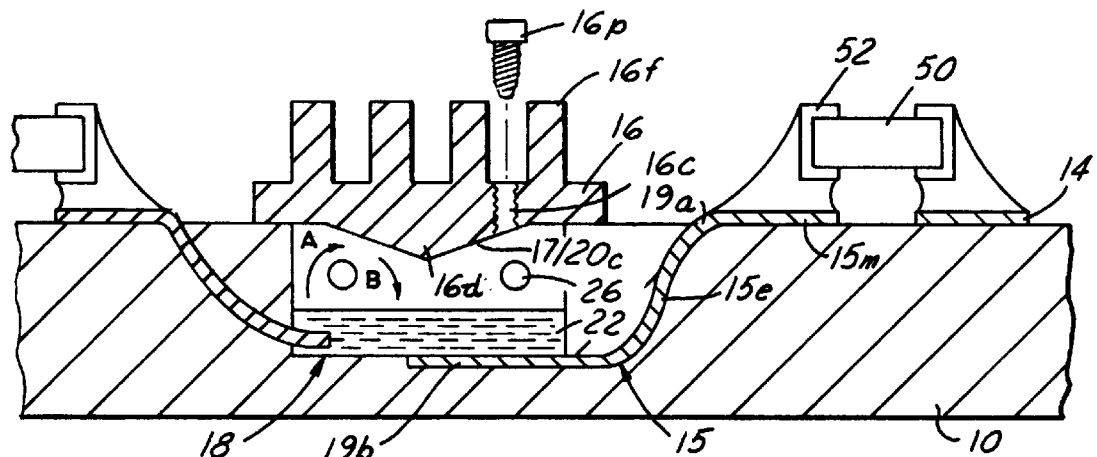
Figure 3:
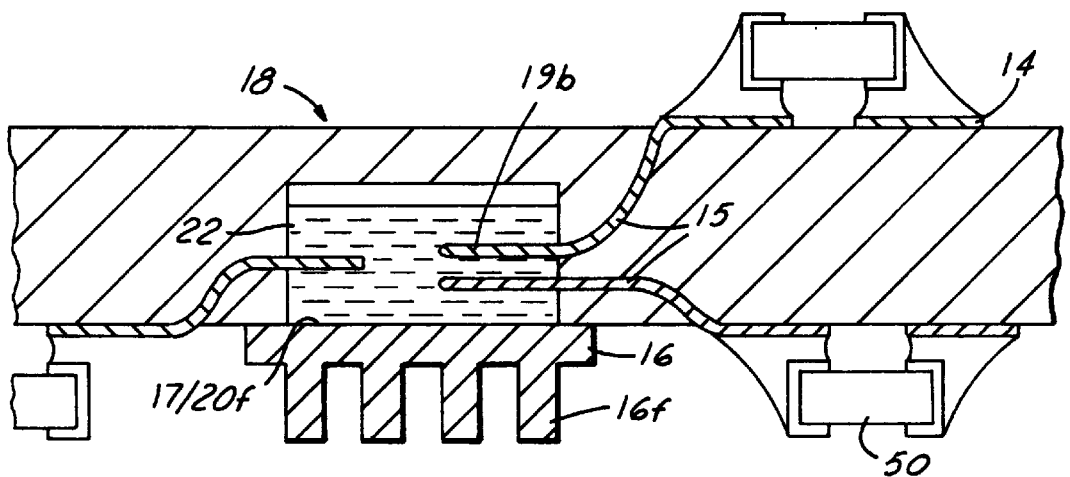
Figure 4:
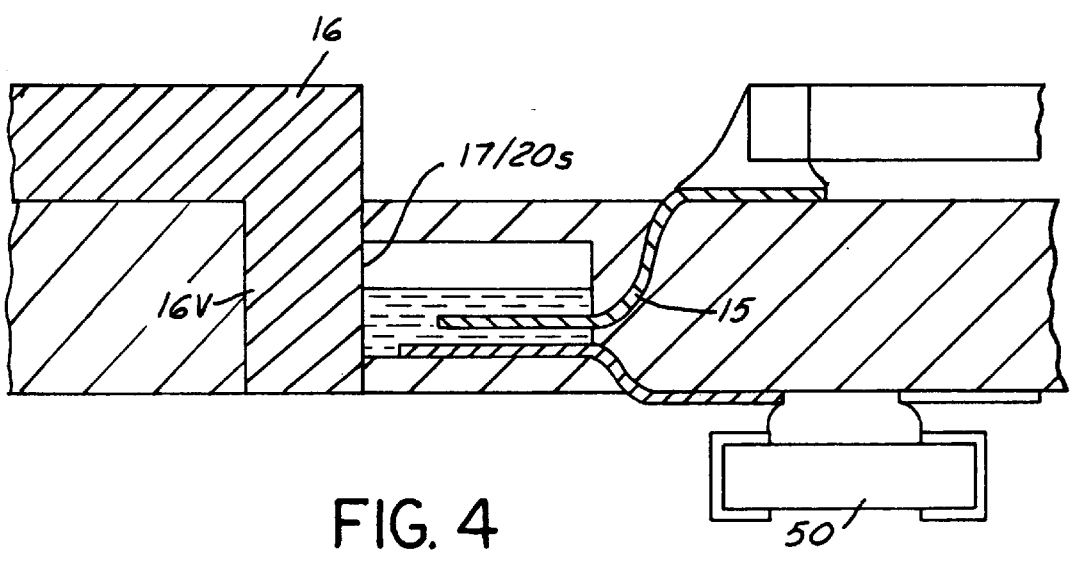
Figure 5:
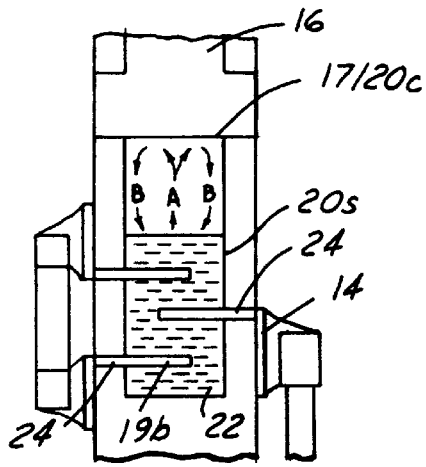

The heat sink 16 may comprise a metal plate or other structure that is attached to a surface 12 of the substrate (e.g., by fasteners or an adhesive) as in FIGS. 2–3, and/or embedded within the substrate 10 as in FIGS. 4–5. The heat sink 16 should be made from a material having a relatively high thermal conductivity, such as aluminum, copper, or alloys containing one or both of these metals.

As mentioned above, the cavity 18 may be a surface cavity as in FIGS. 2–3, or a body cavity which is fully enclosed within the substrate as in FIGS. 4–5. In either case, the cavity 18 is formed such that at least one wall 20 thereof is defined by one or more surface 17 of the heat sink 16. The cavity wall 20 defined by the heat sink surface 17 may be a ceiling 20c, a floor 20f, or a side wall 20s of the cavity 18. When the cavity is a surface cavity and the heat sink surface 17 defines a ceiling 20c or floor 20f of the cavity (as in FIGS. 2–3, respectively), the heat sink surface 17 should be sealed against the substrate/surface cavity so as to prevent leakage of the fluid 22 from the cavity 18. This sealing may be provided by the fastener, adhesive, or other means used to attach the heat sink 16 to the substrate surface 12, and/or by a gasket, O-ring, or other sealing means (not shown).

The mounting pad 14 is disposed on a substrate surface 12 so as to be proximate the cavity 18. The pad 14 is typically copper and may be formed by well-known photolithographic, plating, and etching methods, or may be formed by sputtering, vacuum deposition, or other known means. The pad 14 may also be made from other metals, such as aluminum, tin, and the like. Typically the substrate 10 will carry a plurality of such pads 14 thereon arranged in a predetermined pattern, such that each is positioned in matched relation with a respective termination of an electronic component to be soldered or otherwise attached to the PCB.

The liquid 22 within the cavity is preferably electrically insulative, in order to avoid electrical shorts among the mounting pad(s) 14 and the heat sink 16. The preferred liquid exhibits high density, low viscosity, low surface tension, and high electrical insulating properties; these properties are exhibited, for example, by typical heat transfer fluids. An example of such a liquid is a perfluorinated hydrocarbon, such as FLUORINERT FC-84 marketed by 3M (Minnesota Mining and Mfg.) of St. Paul, Minn. This material has a boiling point of 80° C., pour point of −95° C., density of 1.73 grams/cc, viscosity of 0.55 centipoise at 25° C., and a thermal conductivity of 0.025 BTU/(hr) (ft2) (°F./ft). Many other electrically insulative thermal transfer liquids are suitable as well, such as those containing ethylene glycol, long-chain hydrocarbons combined with oxidation inhibitors, and others.

For most applications, the volume of the liquid should be less than that of the cavity 18 in order for vaporization and condensation of the liquid to occur (as explained below). The liquid volume can be determined depending on such factors as: the size and shape of the cavity; the range of temperatures within which the thermal heat sink 16 can be maintained; the heat output of the SMC 50; the size, shape, and number of terminations and associated solder joints; the solder joint material (e.g., eutectic tin/lead solder, silver-filled epoxy, etc.); the materials the mounting pads 14, thermally conductive members 24, and thermal heat sinks 16 are each made of; the size and shape of the pads 14, members 24, and heat sinks 16; and so forth. When a surface cavity is to be used, the liquid 22 may be poured into the cavity 18 and the heat sink 16 attached and sealed to the substrate surface 12 such that the heat sink surface 17 forms one or more walls 20 of the cavity. On the other hand, when a body cavity is to be used, the liquid 22 may be injected into the cavity 18 by gas-assist, vapor-assist, or other techniques during the molding of the substrate 10. Alternatively, the body cavity may have a small tube or port extended from the substrate surface 12 and into the cavity 18, through which the liquid 22 may be poured or injected, followed by capping or plugging the tube/port. Or, the heat sink 16 may have a channel 16c therethrough, through which the liquid 22 may be poured, injected, etc., so that the cavity 18 may be filled or replenished with the liquid 22 as desired. A cap, screw, plug, valve, or other means 16p may be included for sealing the cavity/channel after filling or replenishment.

The thermally conductive member 24 is disposed and arranged within the substrate 10 such that it lies in direct thermal contact with both (1) the mounting pad 14 and (2) the liquid 22 within the cavity 18. Like the heat sink 16, the conductive member 24 should be made of copper, aluminum, an alloy of copper and/or aluminum, solder, or a similar material having high thermal conductivity. The member 24 may, for example, be a pin which is insert-molded or added in after molding; or, the member 24 may optionally be made integral with the mounting pad 14, and the single-piece pad/member 15 may be insert-molded or otherwise affixed into the substrate as shown in FIGS. 2–4. In this arrangement, the single-piece pad/member 15 has (1) a mounting portion 15m (analogous to the mounting pad 14) mounted on the surface 12 of the substrate 10 proximate the cavity 18, and (2) an embedded portion 15e (analogous to the thermally conductive member 24) embedded within the substrate and having a first end 19a contiguous with the mounting portion 15m and a second end 19b in direct thermal contact with the liquid 22. Whether the pad and conductive member comprise one piece (15) or two (14 & 24), the member/embedded portion 24/15e should not be in physical (nor electrically conductive) contact with the heat sink 16.

The end 19b of the conductive member/embedded portion 24/15e distal from the mounting pad/mounting portion 14/15m is disposed within the substrate so as to be in direct thermal and physical contact with the electrically insulative liquid 22. This end 19b extends into the cavity 18, preferably through a side wall 20s or through the floor 20f. In either case, the end 19b may extend into the liquid 22, or may simply define at least a portion of the wall 20s or floor 20f.

Alternatively, the thermally conductive member 24 may comprise a thermal via 30 extending at least from a substrate surface 12 to the liquid 22 within the cavity 18. The via 30 may have a thermally conductive material 32 therein which thermally connects the mounting pad 14 with the liquid 22, wherein the material 32 preferably has a melting point above the boiling point of the liquid 22. For example, the material 32 may be a tin, copper, or solder coating/plug within the via 30. As exemplified in FIG. 6, the thermally conductive member 24 may comprise one or more copper-plated through holes (PTHs), or one or more non-plated through holes containing thermally conductive epoxy 32 or metal pins 24, for example.

When a surface mount component 50 is soldered or otherwise connected to its respective mounting pad(s) 14, it will produce a certain amount of heat which will tend to heat up the mounting pads 14, which in turn heats up the thermally conductive member 24, and which in turn heats up the liquid 22. When the liquid 22 is heated above its boiling point, at least some of the liquid will vaporize (represented by arrow A) and subsequently condense against the relatively cooler heat sink 16 and flow or drip back into the main body of liquid (represented by arrow B). (The heat sink 16 is preferably maintained at a temperature below the boiling point of the liquid.) This vaporization/condensation process provides the advantage of transferring heat away from the mounting pads 14 (and beneficially away from the SMC 50) and into the cooler heat sink 16.

A preferred embodiment of the present invention is illustrated in FIGS. 2 and 5, wherein the heat sink surface 17 is disposed generally above the liquid 22. In this configuration, the vaporized liquid rises along the path indicated by arrow A and contacts the relatively cooler heat sink surface 17 (which forms the cavity ceiling 20c in this configuration). The vapor then condenses against the heat sink surface 17—thus giving up its latent heat of vaporization to the heat sink 16—and drips back into the liquid pool 22 below, along arrow B. With proper selection, sizing, and placement of the cavity, liquid, heat sink, etc., a continuous vaporization/condensation cycle of the liquid is sustained whenever the component is generating a given level of heat. This component heat sinking scheme rivals the performance of conventional solid metal heat sinks, and provides the added advantage that electrically insulative/thermally conductive adhesives can be eliminated from the thermal path.

It should be noted that vaporization occurs not only at the liquid surface, but also beneath the surface in the form of bubbles which subsequently rise to the surface. Thus, the heat sink 16 may be shaped and positioned such that some (or even all) of the heat sink 16 may be submerged beneath the surface of the liquid 22, as is the case with the vertical portion 16v of the heat sink 16 in FIG. 4. Here, gas bubbles may condense against the heat sink 16v and give up their latent heat of vaporization to the heat sink.

FIG. 3 illustrates a non-preferred embodiment that is less effective than the configuration shown in FIG. 4. Here, very little (if any) of the gas bubbles condense against the heat sink surface 17 which defines the cavity floor 20f. However, some heat is transferred from the conductive member 24 to the heat sink 16 by conduction/convection through the fluid 22.

In order to assist in the desired vaporization/condensation cycle of the liquid, one or more vanes or guides 26 may be affixed within the cavity 18, as shown in FIG. 2. Such vanes 26 may act to promote circulation of the vapor/condensate/liquid thereabout, as illustrated by arrows A and B. These vanes 26 may be made of metal, plastic, ceramic, or other suitable materials, but are preferably made of a material (e.g., plastic or ceramic) having a thermal conductivity lower than that of the thermal heat sink 16 in order to urge the condensation of liquid vapor to occur primarily upon the heat sink 16 and minimally upon the vane 26. The vane(s) 26 may be situated within the cavity 18 by insert-molding or by other suitable means, and may optionally be made integral with the heat sink 16 and/or the conductive member/embedded portion 24/15e.

Figure 8:
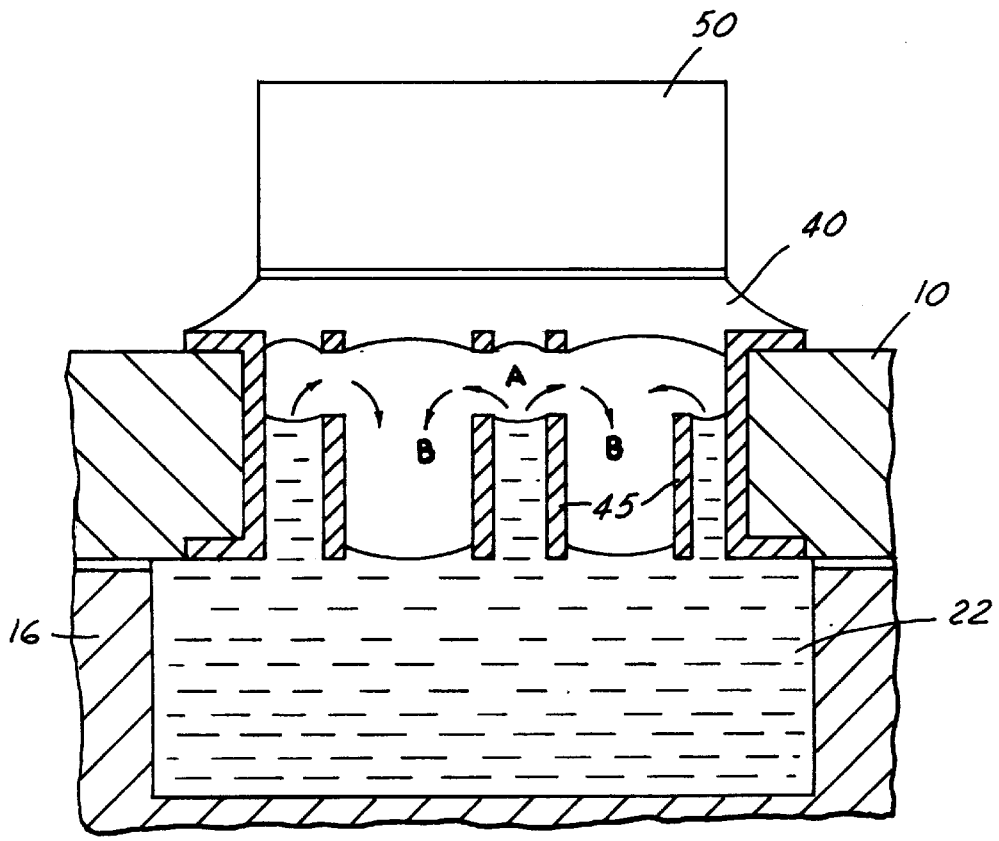
FIGS. 2–8 are section views of a printed circuit board according to the present invention.
Figure 7:
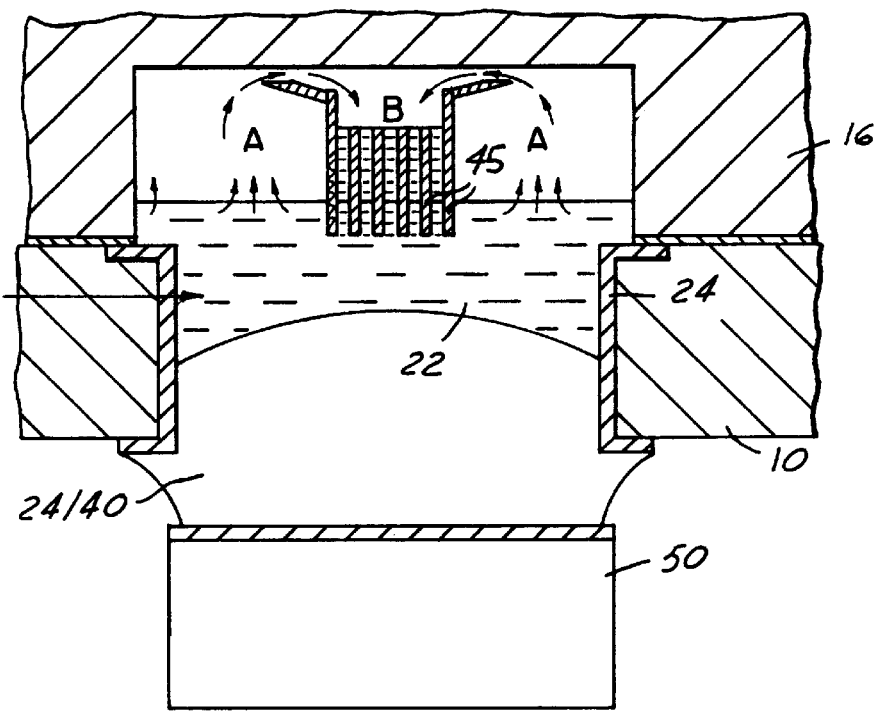

In the aforementioned embodiments, condensed vapor is recycled back into the liquid pool predominantly by the action of gravity. This makes the performance of these embodiments strongly dependent on the spatial orientation of the PCB as in its end use. FIGS. 7–8 show alternative embodiments which make use of the capillary effect to control or enhance liquid recirculation. In these embodiments, small tubes or channels formed by closely spaced plates 45 are designed to allow the liquid 22 to "wick" into the tubes/channels by capillary action. The surface of the tubes/channels should be selected from materials, surface finishes, etc. which promote this wicking action. It is important to note that this capillary action may take place even against gravity. The capillaries/tubes/plates may be embedded in the substrate, and in direct thermal contact with the heat source. Vapor may evolve at the hotter surfaces of the capillaries, and be driven by pressure generated by the continuously evolving vapor toward the recycled liquid pool; or, they could be embedded in the heat sink. In this case, the cold capillary walls provide a site for condensation, and the capillary action draws the vapor-liquid interface towards the cold heat sink surfaces. In both of these embodiments, the capillary action significantly reduces the dependency of the invention on spatial orientation with respect to gravity. For a capillary to be functional, however, the liquid pool must contact the entrance to the capillary. In addition, the liquid pool must contact at least some portion of the heated surface.

Figure 6:
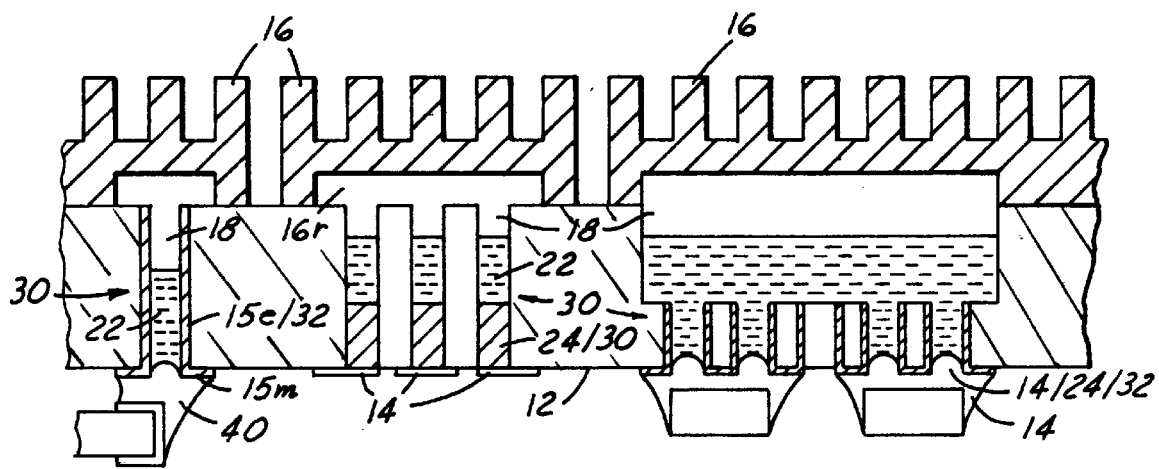

Various other modifications to the present invention may occur to those skilled in the art to which the present invention pertains. For example, the heat sink 16 may have fins 16f or other features as shown in FIGS. 2–3 for enhancing heat dissipation. Also, the "ceiling" 20c of the cavity 18 may be sloped downward toward a point or edge 60, toward which the condensing liquid may flow and from which it may drop when the vapor condenses on the heat sink surface/cavity ceiling 17/20c, as illustrated in FIG. 2. Additionally, the heat sink 16 may have a recess 16r therein in open communication with the surface cavity or body cavity 18, as illustrated in FIGS. 6–8. This recess 16r can be considered an extension of the substrate cavity 18. Also, the thermally conductive member 24 may comprise a solder joint 40, as illustrated in FIGS. 6–8. Furthermore, it is generally preferable that the mounting pad 14, thermally conductive member 24, and any portions thereof not be in direct or indirect electrical contact with the thermal heat sink 16. This is facilitated by not placing the mounting pad/thermally conductive member in physical contact with the thermal heat sink 16, and by using a liquid 22 that is electrically insulative. This is done because the thermal heat sink 16 may serve as a thermal well for more than one mounting pad/thermally conductive member, and in such cases it would generally be desired that the thermally adjoined mounting pads 14 be electrically insulated or isolated from one another in order to avoid shorts and crosstalk therebetween. Moreover, it should be noted that, as used herein, any words which imply direction or spatial orientation—such as "top", "bottom", "upper", "lower", "above", "beneath", "ceiling", "side", "floor", and the like—depend for their meaning on the end-use orientation of the PCB with respect to "gravitational" direction. For example, roughly the same PCB structure is shown in FIGS. 2 and 3, but in FIG. 2 the heat sink surface 17 defines a "ceiling" 20c of the cavity "above" the liquid, whereas in FIG. 3 this same surface 17 defines a "floor" 20f "beneath" the surface of the liquid. (It may be seen that FIGS. 2 and 3 are oriented "upside-down" with respect to each other.) Other modifications not expressly mentioned herein are also possible and within the scope of the present invention. It is the following claims, including all equivalents, which define the scope of the present invention.

What is claimed is:

1. A printed circuit board, comprising:

a dielectric substrate;

a solid metallic heat sink attached to or embedded within said substrate;

a cavity formed generally in said substrate, wherein the cavity has a first predetermined volume and wherein at least one wall of the cavity is defined by a surface of said heat sink;

a component mounting pad disposed on said substrate proximate the cavity;

a second predetermined volume of electrically insulative liquid contained within the cavity; and a thermally conductive member disposed within said substrate, said member being in direct thermal contact with said mounting pad and said liquid.

2. A printed circuit board according to claim 1, wherein heat may be transferred from said mounting pad through said thermally conductive member and to said liquid so as to heat said liquid above its boiling point, such that at least some of said liquid vaporizes and condenses against said heat sink.

3. A printed circuit board according to claim 1, wherein said liquid is selected from the group consisting of perfluorinated hydrocarbons, ethylene glycol, and long-chain hydrocarbons mixed with an oxidation inhibitor.

4. A printed circuit board according to claim 1, wherein said second predetermined volume is less than said first predetermined volume.

5. A printed circuit board according to claim 1, wherein at least one of said heat sink, said thermally conductive member, and said mounting pad is made of aluminum, copper, or an alloy thereof.

6. A printed circuit board according to claim 1, further comprising at least one vane affixed within the cavity for promoting circulation of said liquid therewithin.

7. A printed circuit board according to claim 6, wherein said vane is integral with at least one of said heat sink and said thermally conductive member.

8. A printed circuit board according to claim 1, wherein said thermally conductive member is integral with said mounting pad.

9. A printed circuit board according to claim 1, further comprising an electronic surface mount component attached to said mounting pad.

10. A printed circuit board according to claim 1, further comprising a plurality of closely spaced tubes or plates within the cavity positioned generally above a top surface of said liquid and defining capillaries between adjacent tubes or plates, wherein a first end of each capillary is submerged beneath said top surface of said liquid and wherein a second end of each capillary is disposed above said top surface of said liquid.

11. A printed circuit board, comprising:

a dielectric substrate;

a solid metallic heat sink attached to or embedded within said substrate;

a cavity formed generally in said substrate, wherein the cavity has a first predetermined volume and wherein at least one wall of the cavity is defined by a surface of said heat sink;

a second predetermined volume of electrically insulative liquid contained within the cavity; and at least one component mounting pad comprising a mounting portion disposed on said substrate proximate the cavity and an embedded portion embedded within said substrate, wherein each embedded portion is disposed in direct thermal contact with said liquid in the cavity.

12. A printed circuit board according to claim 11, wherein heat may be transferred from each mounting pad to said liquid so as to heat said liquid above its boiling point, such that at least some of said liquid vaporizes and condenses against said heat sink.

13. A printed circuit board according to claim 11, wherein said liquid is selected from the group consisting of perfluorinated hydrocarbons, ethylene glycol, and long-chain hydrocarbons mixed with an oxidation inhibitor.

14. A printed circuit board according to claim 11, wherein said second predetermined volume is less than said first predetermined volume.

15. A printed circuit board according to claim 11, wherein at least one of said heat sink and said at least one mounting pad is made of aluminum, copper, or an alloy thereof.

16. A printed circuit board according to claim 11, further comprising at least one vane affixed within the cavity for promoting circulation of said liquid therewithin.

17. A printed circuit board according to claim 16, wherein said vane is integral with said heat sink.

18. A printed circuit board according to claim 11, further comprising a plurality of closely spaced tubes or plates within the cavity positioned generally above a top surface of said liquid and defining capillaries between adjacent tubes or plates, wherein a first end of each capillary is submerged beneath said top surface of said liquid and wherein a second end of each capillary is disposed above said top surface of said liquid.

19. A printed circuit board, comprising:

a dielectric substrate;

a solid metallic heat sink attached to or embedded within said substrate;

a cavity formed generally in said substrate, wherein the cavity has a first predetermined volume and wherein at least one wall of the cavity is defined by a surface of said heat sink;

a second predetermined volume of electrically insulative liquid contained within the cavity; and at least one component mounting pad comprising a mounting portion disposed on said substrate proximate the cavity and an embedded portion embedded within said substrate, wherein each embedded portion is disposed in direct thermal contact with said liquid in the cavity, wherein heat may be transferred from each mounting pad to said liquid so as to heat said liquid above its boiling point, such that at least some of said liquid vaporizes and condenses against said heat sink.

20. A printed circuit board according to claim 19, wherein said liquid is selected from the group consisting of perfluorinated hydrocarbons, ethylene glycol, and long-chain hydrocarbons mixed with an oxidation inhibitor.

21. A printed circuit board according to claim 19, wherein said second predetermined volume is less than said first predetermined volume.

22. A printed circuit board according to claim 19, further comprising at least one vane affixed within the cavity for promoting circulation of said liquid therewithin.

23. A printed circuit board according to claim 19, further comprising a plurality of closely spaced tubes or plates within the cavity positioned generally above a top surface of said liquid and defining capillaries between adjacent tubes or plates, wherein a first end of each capillary is submerged beneath said top surface of said liquid and wherein a second end of each capillary is disposed above said top surface of said liquid.

* * * * *